United States Patent [19]

Evans et al.

[11] Patent Number: 4,919,507
[45] Date of Patent: Apr. 24, 1990

[54] SEMICONDUCTOR RADIATION COUPLING SYSTEM

[75] Inventors: Gary A. Evans, West Windsor Township, Mercer County; Jay B. Kirk, Hamilton, both of N.J.

[73] Assignee: General Electric Company, Schenectady, N.Y.

[21] Appl. No.: 349,607

[22] Filed: May 10, 1989

[51] Int. Cl.$^5$ ............................................. G02B 6/34
[52] U.S. Cl. ............................... 350/96.19; 350/96.12
[58] Field of Search ................. 350/96.12, 96.13, 96.19

[56] References Cited

U.S. PATENT DOCUMENTS

| | | | |
|---|---|---|---|
| 3,753,801 | 8/1973 | Lockwood et al. | 148/171 |
| 4,497,535 | 2/1985 | Winful et al. | 350/96.12 |

OTHER PUBLICATIONS

H. M. Stoll; Distributed Bragg deflector: a multifunctional integrated optical device. Appl. Opt. vol. 17, No. 16 15 Aug. 1978.
G. A. Evans; et al., Surface-emitting second order distributed Bragg reflector laser with dynamic wavelength stabilization and far-field angle of 0.25° Appl. Phys. Lett. 49 (6), 11 Aug. 1986.
Shyh Wang, et al., Two-dimensional distributed-feedback lasers and their applications. Appl. Phys. Lett., vol. 29. No. 9, 1 May 1973.
Won-Tien Tsang, Shyh Wang; Microfabrication of two-dimensional periodic arrays by laser beam interferometric technique, Appl. Phys. Lett. vol. 27 No. 2, 15 Jul. 1975.
J. M. Hammer, et al., Phase-locked operation of coupled pairs of grating-surface-emitting diode lasers. Appl. Phys. Lett. 50 (11), 16 Mar. 1987.
N. W. Carlson, et al., Phase-locked operation of a grating-surface-emitting diode laser array. Appl. Phys. Lett. 50 (19), 11 May 1987.
G. A. Evans, et al., Efficient 30 mW grating surface-emitting lasers Appl. Phys. Lett. 51 (19) 9 Nov. 1987.

Primary Examiner—William L. Sikes
Assistant Examiner—Robert E. Wise
Attorney, Agent, or Firm—Paul R. Webb, II; James C. Davis, Jr.

[57] ABSTRACT

A first array of laser diode devices are optically coupled by a diffraction grating comprising a plurality of spaced diffraction nodules in a grid array optically coupled to the devices. The light emitted from a device of the first array can pass through the grid array to a second device, reflect back to the emitting device in a Distributed Bragg Reflector (DBR) mode and deflect orthogonal to the emitted light optical axis to a third device in a Distributed Bragg Deflector (DBD) mode. The light from the second and third devices can be coupled to other laser diode devices by still further diffraction nodule arrays to produce phased-locked beams; beam steering of portions of the light and other effects.

26 Claims, 3 Drawing Sheets

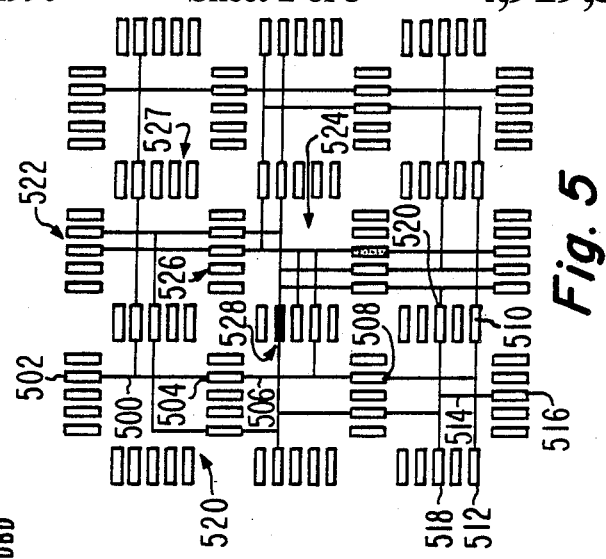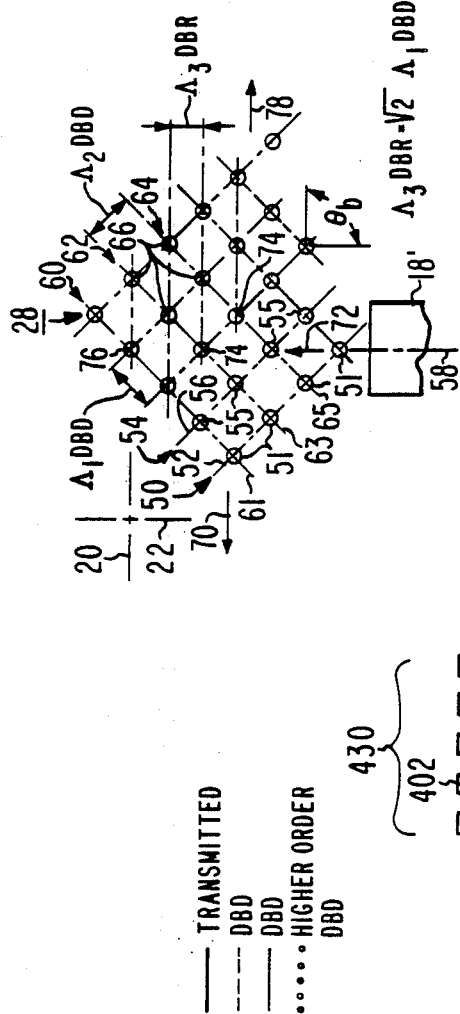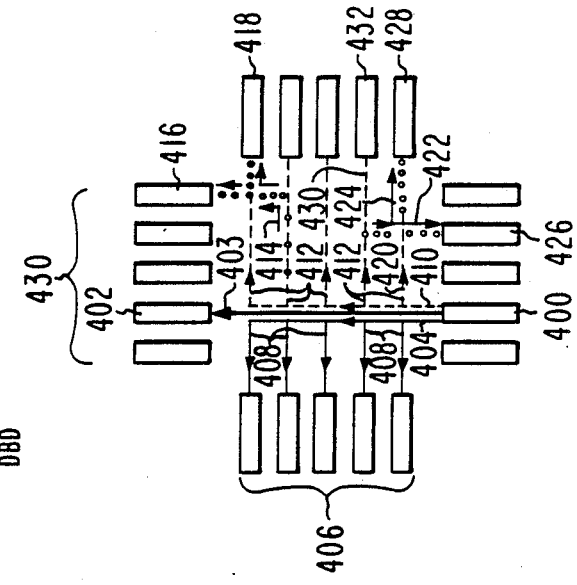
Fig. 5
Fig. 3
Fig. 4
—— TRANSMITTED
--- DBD
····· HIGHER ORDER DBD

SEMICONDUCTOR RADIATION COUPLING SYSTEM

This invention relates to a system for coupling radiation to and from semiconductor radiation emitting devices.

BACKGROUND OF THE INVENTION

Semiconductor laser arrays typically comprise a plurality of semiconductor injection lasers which are formed on a planar substrate. Radiation is, in certain devices, emitted from the device surface such that the optical axis of the radiation is typically about perpendicular to the plane of the substrate. In forming a laser array it is typically desirable that the lasers be phase-locked so that the output of each of the lasers is coherent with that of the others and the array behaves as a single light source. Evanescent coupling is one technique which provides phase locking between adjacent parallel devices. However, this technique is limited in that radiation coupling usually occurs only between next adjacent neighbors. Other array arrangements include linear arrays formed by coupling a portion of a first device's output into a second device's input which is aligned with the optical output of the first device. This latter arrangement is limited to a one-dimensional array.

The present inventors recognize it would be desirable to form a two-dimensional array of lasers which may be locked in phase wherein the devices may be organized into one or more arrays such that all devices are radiation coupled without being next adjacent neighbors or solely linearly aligned so that more devices may be efficiently coupled in a relatively smaller region of the substrate.

A light coupling system according to the present invention for coupling radiation emitted by a semiconductor radiation emitting device comprises a substrate having a broad planer surface. An optical grating comprising a plurality of spaced nodules overlies the substrate broad surface. The grating is adapted to receive the emitted radiation along an optical axis lying in a plane parallel to the plane of the broad surface. The nodules are arranged in a grid and so positioned that a first portion of the received radiation reflects from the grating in a direction along the optical axis and a second portion of the received radiation is deflected by the grating in a second direction different than the first direction. As a result, multiple radiation emitting devices adapted to process radiation received thereby may be coupled for providing phase-locking of the radiation emitted by the devices.

In the drawing:

FIG. 3 is a plan view of a grating portion of the system of FIG. 1;

FIG. 4 is a schematic plan view diagram of a system similar to the system of FIG. 1 useful for explaining some of the principles of the present invention;

FIG. 5 is a schematic plan view diagram of a plurality of coupled systems of the type illustrated in FIG. 4.

DETAILED DESCRIPTION

Figure 1:
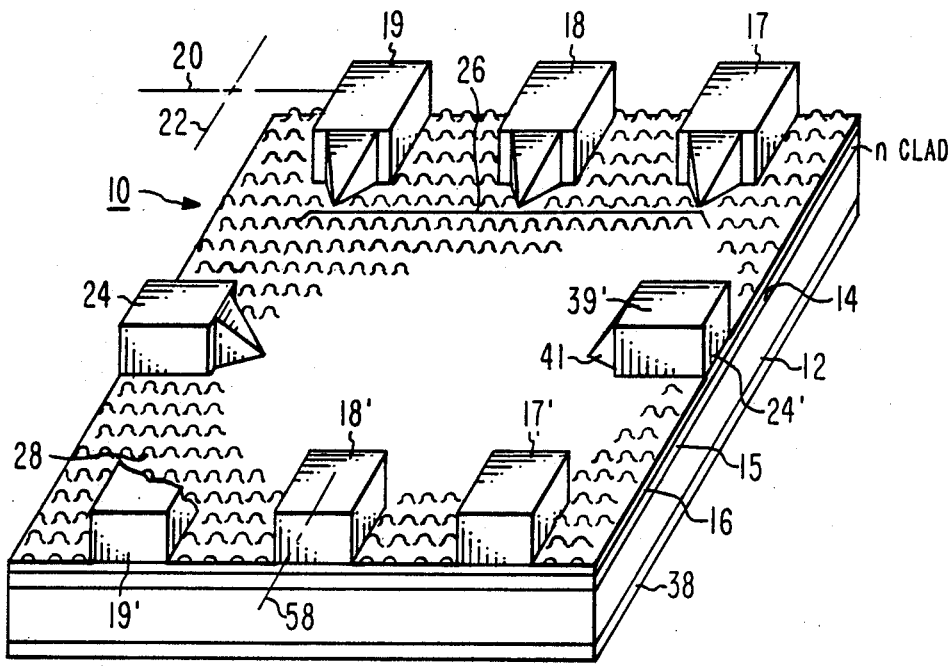
FIG. 1 is an isometric view of a radiation coupling system in accordance with one embodiment of the present invention.

In FIG. 1, system 10 comprises a semiconductor 12 having a broad surface 14. Overlying broad surface 14 is an N-type conductivity clad layer 15 and a large optical cavity (LOC) layer 16 overlying the clad layer 15. Overlying the LOC layer 16 is a first linear array of laser diode gain sections 17–19, inclusive. Sections 17–19 are aligned parallel to axis 20. The sections 17–19 emit radiation parallel to a second axis 22 normal to axis 20 and parallel to surface 14. Axes 20 and 22 define a plane parallel to broad surface 14. A second array of laser diode gain sections 17'–19', inclusive, are on LOC 16 spaced from sections 17–19 and respectively aligned therewith. The devices 17'–19', inclusive, are aligned parallel to axis 20 and each emit radiation in a direction parallel to axis 22. Diode section 17' is aligned with section 17 on an axis parallel to axis 22. The sections 17–17' are oriented to emit radiation toward one another. Similarly section 18' is aligned with section 18 and section 19' is aligned with section 19 in directions parallel to axis 22. The sections 18–18' emit radiation toward one another as do sections 19–19', respectively.

A second array of laser diode sections 24–24' are on LOC layer 16. Section 24 is aligned with section 24' in a direction parallel to axis 20. The sections 24–24' each emit radiation toward one another. By way of example, section 24 lies on a line which is to the left (in the drawing) of the alignment of sections 19–19' whereas section 24' is aligned to the right of the alignment of section 17–17'. The array of laser diode sections 17–19, 17'–19', and 24–24' define a central and relatively square region 26. Located in region 26 and formed on LOC layer 16 is an optical grating 28 in accordance with one embodiment of the present invention. The spacings of sections 17 to section 18 and section 18 to section 19 are substantially the same. The spacings of sections 24–24' to the array of sections 17–19 and 17'–19' is also substantially the same. While the symmetrical disposition of the laser diode sections is preferred, this is by way of example only. In other embodiments, the sections may be misaligned in accordance with a given implementation. For example, sections 24–24' may be misaligned relative to an axis parallel to axis 20 and similarly any of the devices 17–19 may be misaligned relative to any of the sections 17'–19' in a direction parallel to axis 22. Each of the sections are identical to the representative section 24', FIG. 2, in the present embodiment. However it should be understood that the sections may differ in accordance with different implementations.

The grating 28 overlies the LOC 16 surface throughout the region overlying broad surface 14 of the substrate 12. The optical axis of each of the sections is parallel to surface 14. The grating 28 is one which permits transmission of light from each device gain section to be passed through the grating region to the aligned opposing gain device section. For example, light emitted from section 24' is emitted toward and transmitted by the grating 28 to section 24 and vise versa. Similarly light from section 17 is emitted toward and is incident on and received by laser diode gain section 17 and so on. The grating 28, in addition to permitting the light to be transmitted directly to aligned diode sections also causes Bragg reflections back to the emitting device and causes light deflection in the transverse direction perpendicular to the emission direction.

Figure 2:
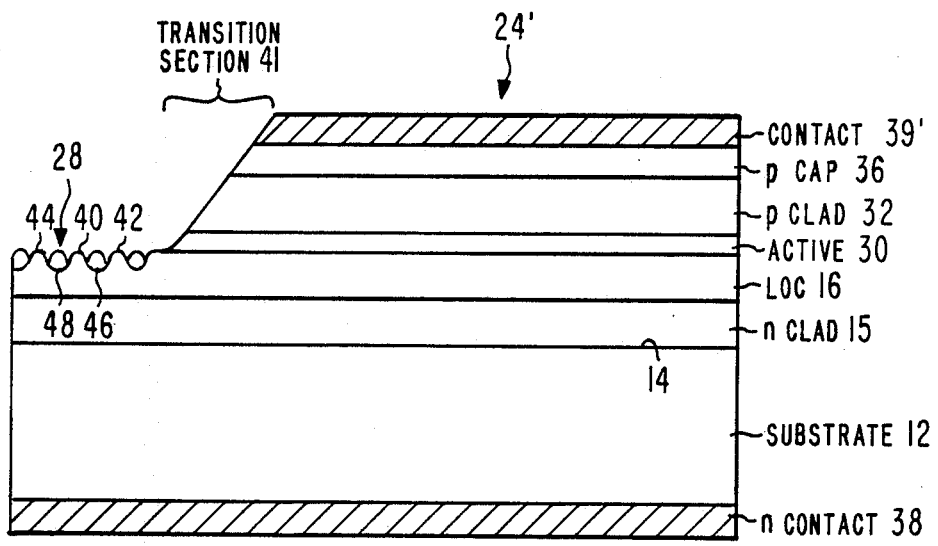
FIG. 2 is a sectional elevation view of a typical laser gain section of the system of FIG. 1.

The grating 28 comprises a plurality of nodules, each nodule being surrounded by a valley. In FIG. 2, for example, nodule 40 is spaced from nodule 42 and 44 by intervening valleys 46 and 48, respectively. The array of nodules in the grating 28 are symmetrically disposed. In FIG. 3, the array of nodules in a first array 50 of nodules 51 are aligned on axis 52. A second array 54 of nodules 55 are aligned on axis 56 parallel to axis 52. All of the nodules of the grating 28 are aligned on axes parallel to axes 52 and 56.

A representative device formed by section 18' has an optical axis 58. Axis 58 is parallel to axis 22, FIG. 1. Axis 58 is oriented 45° to axes 52 and 56 of respective arrays 50, 54 and so on. The nodules of the grating, however, are also aligned in second arrays such as arrays 60, 62, 64 and so on. The arrays 60,62, and 64 are parallel to each other but are aligned on respective axes 61, 63, 65 and so on which are orthogonal to axis 52 and 56. Axes 60, 62, 64 are also at an angle 45° to axis 22.

Axes 61, 63, 65 are 45° to axis 58 of the device section 18'. A next adjacent quaternary array of nodules such as nodules 66 are symmetrical in a square array in this embodiment. All the nodules form similar quaternary square arrays. The nodules are somewhat rounded mounds or hemispherical in shape with the valleys therebetween. The circles of FIG. 3 are representative rather than specific descriptions of the shape of the nodules. These circles are given merely for purpose of explanation and simplicity of illustration. The interconnection of the nodules is an approximation of a sinusoidal-like curve as illustrated in FIG. 2.

The nodules 51 in the array 28, FIG. 3, are aligned with other nodules to form a first grating having a period $\Lambda_1$.

For example, the nodules of array 50 in combination with the nodules of array 54 have a grating period of $\Lambda_1$. Because the spacing between the arrays in the direction normal to arrays 50 and 54 is equal, the spacing between each of the nodules of the arrays parallel to the arrays 50 and 54 is a constant grating period $\Lambda_1$. Because the array of nodules is symmetrical, the nodules of array 60 are spaced from the nodules of the array 62 and the array of 62 is spaced from array 64 a second period $\Lambda_2$. The spacings of the nodules is identical throughout the grating array, $\Lambda_1$ being identical to $\Lambda_2$.

The grating period $\Lambda_1$ is such that it causes the nodules to deflect emitted radiation, e.g., from a device corresponding to section 18' along axis 58, in a direction normal to axis 58, e.g., direction 70. That is, the photons emitted from the section 18' in the direction 72 when incident upon each nodule aligned on axis 58 are deflected by that nodule in a direction parallel to direction 70 due to the presence of period $\Lambda_1$. Thus the nodule 51 aligned on axis 58 tends to deflect some of the photons in a direction parallel to direction 70. Similarly, nodule 55 on axis 58 also tends to deflect some photons in direction 70 as does each of the remaining nodules 74 and 76 and so on aligned on axis 58. The photons deflected by the grating are caused to propagate in a direction aligned on axis 58 and in a direction normal to axis 58.

Similarly, the period $\Lambda_2$ of those nodules oriented parallel to arrays 60, 62, and 64 and so on on axes 61, 63, 65, respectively, has a value such that the nodules reflect photons emitted along axis 58 by section 18' in a direction 78 parallel to axis 20 and in a sense opposite to direction 70. Each of the nodules that are aligned on axis 58 deflect some of the photons in direction 78 due to the period $\Lambda_2$ of the grating. A third grating period $\Lambda_3$ is formed by the nodules of the grating array 28. The period $\Lambda_3$ forms a distributed Bragg Reflector (DBR) grating which causes photons to be reflected back along the optical path of the diode device, e.g. section 18', on axis 58 in a conventional distributive Bragg reflector (DBR) mode. The period $\Lambda_3$, because of the angular arrangement of the periods $\Lambda_1$ and $\Lambda_2$ at 45° to axis 58, is $\sqrt{2}\,\Lambda_1$ or $\sqrt{2}\,\Lambda_2$. The periods $\Lambda_1$ and $\Lambda_2$ are referred hereinafter as Distributed Bragg Deflector (DBD) periods as compared to the DBR period $\Lambda_3$. Thus, the grating array 28 forms two DBD periods $\Lambda_1$ and $\Lambda_2$ and a third DBR period $\Lambda_3$. A general analysis of DBD systems employing linear grating elements is discussed in more detail in an article by H. M. Stoll entitled Distributed Bragg Deflector: a Mulitfunctional Integrated Optical Device in *Applied Optics* Vol. 17, Aug. 15, 1978, 2563-2569.

Depending on the magnitude of $\Lambda_1$ and $\Lambda_3$, different orders of light may be reflected as DBR reflections, may be deflected as DBD reflections and the grating may be of such arrangement as to cause light to emit from the grating surface and/or in the direction into the substrate. For example, light is diffracted 90° which locks up the light of laser of section 18' with the light of an array of lasers oriented 90° to the section 18' providing feedback in second order for laser oscillations and couples light out of the surface of the grating array and into the substrate 12 in first order. For example, in FIG. 1, section 18' is optically coupled to sections 24-24' and to section 18. Photons from section 18' pass through the grating region field 26 to section 18. Photons due to the presence of the $\Lambda_1$ and $\Lambda_2$ DBD deflective grating periods are also deflected 90° to sections 24-24'. Still other photons may be emitted from the surface of the grating in a direction non-parallel to the plane of the surface 14 of the substrate 12.

It can be shown that the photons from section 18' are coupled similarly as photons from the other sections of the array. For example, in FIG. 4, a laser diode 400 emits photons that are directly transmitted through the grating array to the laser diode 402. The lighter solid line 404 represents photons which are diffracted and deflected to the lasers of a bank of lasers 406. The photons represented by line 404 are dispersed into a plurality of parallel photon paths as indicated by the arrows 408. The dash line 410 illustrates another set of photons which are deflected by a Distributed Bragg Deflector grating period $\Lambda_2$ in the direction of arrows 412. However, higher order photons are diffracted by the grating nodules in a number of different paths as represented by the arrays of small circles. One path distributes the photons from path 410 to path 414 which branches to laser diode devices 416 and 418. Path 420 contains photons which follow path 422 and 424 to laser diode devices 426 and 428, respectively. Photons from path 430 not only are passed to diode 432 but also branch to paths 422 and 424. The branching illustrated is by way of example as the photons from a given device are coupled to each and every device in the array in this example. Photons received by a given laser diode device are amplified and reemitted by that laser diode device into the grating array for further distribution among the different laser devices resulting in phase-lock action. The distribution of photons in FIG. 4 is given only by way of example with the laser diode device 400 emitting photons. However, in practice all of the laser devices illustrated in FIG. 4 emit and amplify received photons.

As a result, all other laser diode devices are optically coupled and produce a phase-locked radiation signal.

The relationship between the Bragg Diffraction angle $\theta_b$, the grating wave vector K, and the free space wave vector $K_0$ is given by:

$$K = 2K_0 \sin(\theta_b/2)$$

Where $K_0 = 2\pi/\lambda_0$, $K = 2\pi/\Lambda$, $\lambda_0$ is the free space wavelength, and $\Lambda$ is the mechanical grating period.

The Bragg diffraction angle ($\theta_b$), FIG. 3, is the angle of deflection of photons in directions 70 and 78 and, in this case is 90° for periods $\Lambda_1$ and $\Lambda_2$. The Bragg diffraction angle for $\Lambda_3$ of course is 180° for each lasing device. Thus both dimensions of the array of devices, FIG. 4, e.g., array 406 lies in one dimension and array 430 lies in a second dimension, are coupled by the same optical locking mechanism. Arrays that depend on evanescent coupling or Y guides for locking in one dimension are ultimately limited by the ability to maintain coherence from the first array element to the last. Additionally, evanescent and Y guide coupling occurs only between nearest neighbors, whereas the DBR - DBD coupling mechanism of the grating array of FIG. 1 deflects photons from each laser into al other lasers in a unit cell. A unit cell is as shown in FIG. 1 and comprises a central grating and peripheral lasing devices.

A relatively larger array of multiple cells of laser devices, one of which is illustrated in FIG. 4, are shown in FIG. 5. There are numerous scattering paths in the grating for each laser in the array that allow communication and therefore in principle, locking with any other laser in the array. The different line thicknesses in the drawing figure represent some of the lasing paths. For example, path 500 extends from laser 502 to laser 504 and forms a second path 506 to laser 508 and, eventually, may be diffracted into transverse laser devices 510 and 512. A second path 514 formed by laser 516 may branch to lasers 518 and 520. The direct transmission and deflected scattering as well as higher order scattering of photons through the different gratings of the different cells of the arrays of FIG. 5 is complex and tends to couple all of the lasing devices optically to form a relatively large coherent beam of light of relatively high power or to obtain large aperture narrow beam. Surface emission type gratings in certain implementations need not be used for purposes of providing an optical circuit amplifier using the arrays of FIG. 5. Any number of cells may be incorporated on a single substrate, such as substrate 12, FIG. 1, with the grating array located throughout all of the cells in a single grating dimension corresponding to periods $\Lambda_1$, $\Lambda_2$ and $\Lambda_3$, FIG. 3.

In addition to offering an alternate locking mechanism to evanescent coupling, Y - Guide coupling, or wave guide bends, the vertical and horizontal rows of laser devices in the multiple cells of FIG. 5 add mechanical rigidity to the wafer substrate. This allows thinning the wafer substrate in the grating regions to reduce substrate loss or to provide access to both sides of the EPI - layers. The grating array 28 comprises two second order 90° DBD gratings which are at right angles to each other and which produce an apparent second order DBR grating of period $\Lambda_3$, FIG. 3. The existence of the apparent second order DBR grating of period $\Lambda_3$ has been verified by grating diffraction measurements made on crossed DBD gratings etched into a GaAs substrate. The second order DBR grating was measured at about 4,000 angstroms.

The grating may be formed on the LOC layer 16 employing conventional grating processing techniques with the exception that the lines of conventional Distributed Bragg Reflectors are produced crossing one another at 90°. For example, a photo-resist is applied to the surface of the LOC layer 16 and exposed. The exposure is made to produce parallel lines of a conventional DBR grating oriented at 45° to axis 58, FIG. 3. A second DBR grating is exposed having lines oriented at 90° to the first grating to thereby produce two grating periods $\Lambda_1$ and $\Lambda_2$, FIG. 3. After exposure of the two crossed grating lines, the photo-resist is developed to expose the mounds or nodules of the grating as illustrated in FIGS. 1 and 3. After the resist is developed, a pattern is ion beam etched in a conventional manner. The resulting etching pattern produces the arrays of nodules. Depending on the periods of the grating nodules, different orders of radiation may be deflected, reflected or emitted from the grating as desired.

In FIG. 3, the exemplar axes 61 and 63 of the respective arrays 60 and 62 and the exemplary axes 52 and 56 of the respective arrays 50 and 54 are oriented 45° to the axes 20 and 22 and to the laser diode section axes such as axis 58 of section 18'. In the alternative, the axes 61 and 63 may be parallel to axis 20, and, therefore, parallel to the axes of sections 24 and 24'. Further, the axes 52 and 56 in this case may be parallel to axis 22 and the diode sections 17-19 and 17'-19', FIG. 1. That is, in FIG. 3, the orientation of the nodule array may be rotated 45° from the orientation shown. Assuming the spacing of the nodules otherwise remains the same, the rotated array would have a DBR period value corresponding to the value of periods $\Lambda_1$ and $\Lambda_2$ and a DBD period corresponding to the value of $\Lambda_3$. When so rotated, the value of the DBD $\Lambda$ period would be $\sqrt{2}$ $\Lambda$ DBR period, i.e. $\Lambda$ DBD $= \sqrt{2}$ $\Lambda$ DBR.

In the large cell array of FIG. 5, the grating periods may be made different for cells or cell groups to provide different characteristics to the different groups in accordance with a given implementation. For example, one grating array may have surface emission of photons to provide external coupling of the array. Other grating arrays may not have surface emissions and may provide diffraction and reflection orders such that the light photons pass only within the grating array. Also, different and diverse paths may be made for the photons for amplification in different directions as desired. Structures different from an LOC shown in FIG. 2 may also be used with the grating of the present invention. Such different structures may include a Graded Index Separate Confinement Heterostructure, single or multiple Quantum Well geometry or a conventional Separate Confinement Heterostructure single or multiple Quantum Well geometry.

Table 1 illustrates periods for first and second order DFB/DBR and DBD gratings for Aluminum Galium Arsenide and Indium Galium Arsenide Phosphide material systems.

TABLE 1

| | GRATING PERIODS | |
| --- | --- | --- |
| | AlGaAs Å | InGaAsP Å |
| First-Order DFB/DBR | 1200 | 2250 |
| First-Order DBD | 1697 | 3182 |
| Second-Order DFB/DBR | 2400 | 4500 |

TABLE 1-continued

| | GRATING PERIODS | |
|---|---|---|
| | AlGaAs Å | InGaAsP Å |
| Second-Order DBD | 3394 | 6364 |

In the table, first-order DFB/DBR refers to the Distributed Bragg Reflector feedback grating period $\Lambda_3$. The first-order DBD refers to the grating period required for a Distributed Bragg Deflector period such as $\Lambda_1$ and $\Lambda_2$. The grating period required for a second-order DBD/DBR grating period such as period $\Lambda_3$ is shown as well as for second-order DBD grating periods for the different materials. The simplest and least complex configuration of a DBR-DBD combination grating array is one employing second-order DBD's and the resulting "apparent" second-order DBR grating for feedback and output coupling.

Another approach uses a first-order DBD-grating which could be physically separated from the second-order DBR-grating. For example the DBD-grating could be located at the interface between the waveguide and the top cladding layer and the DBR grating could be located at the interface between the wave guide and the bottom cladding layer. Two additional advantages to this configuration are (1) the DBR grating could be extended continuously into distributed feedback (DFB) structure allowing the maximum fill factor in the output aperture; and (2) the DBD grating and the DBR grating can be independently optimized for the dual role of providing feedback and output coupling.

In FIG. 2, the substrate 12 is typically composed of N-type GaAs about 250 micrometers (μm) thick and having a first major surface 14 parallel to or slightly misoriented from the (100) cyrstallographite plane. The first cladding region 32 is typically about 1.26 μm thick and is typically composed of P-type $Al_xGa_{1-x}As$ where x is about 0.4. The first electrical contact 38 is preferably composed of sequentially deposited germanium, gold nickel and gold layers. The second electrical contact 39 is preferably composed of titanium, platinum and gold layers which are sequentially deposited onto a Zn or Cd diffused surface. It should be understood that other surface emitting device structures which utilize a surface grating are equally applicable to the present invention. The transition section 41 is optional and is discussed in more detail in the articles "Surface-emitting Second Order Distributed Bragg Reflector Laser with Dynamic Wavelength Stabilization and Far-field Angle Of 0.25°'" by G. A. Evans, et.al. *Appl.Phys.Lett.* 49 (6), Aug. 11, 1986, pp. 314-315 and "Phase-locked Operation of a Grating-Surface-Emitting Diode Laser Array" by N. W. Carlson, et.al. *Appl.Phys.Lett.* 50 (19), May 11, 1987, 1301-1303.

The system 10 may be fabricated using standard liquid phase epitaxy techniques to deposit the layers and regions. Suitable liquid phase epitaxy techniques have been disclosed by Lockwood et al. in U.S. Pat. No. 3,753,801 incorporated herein by reference. Photoresist is then formed on the diode gain sections 11 and the second electrical contact 39 is then formed by ion milling outside the diode gain sections. The capping layer 36, second cladding region 32 and active region 18 are then removed outside the diode gain sections typically by a chemical means such as by a buffered HF solution and $H_2SO_4:H_2O_2:H_2O$. The grating region may be formed by forming a plurality of substantially parallel linear elements in two orthogonal directions which is about 45° from the optical axis of emission of the diode gain sections by using standard holographic and etching techniques.

In operation, a bias voltage of proper polarity is applied to the first and second electrical contacts 38 and 39, respectively, producing radiation in the active region 30. This radiation is emitted in part by the grating region. Depending on the implementation, the grating region can emit radiation substantially perpendicular to the plane of the substrate or in other implementations, confine the radiation to the plane of the LOC layer 16. However, the grating region also provides optical feedback thereby enabling certain of the devices 28 to lase. Further, a portion of the light is diffracted, typically at an angle of 90°, in different directions in the plane of the LOC layer 16 such that light is coupled to all of the other devices. This enables both dimensions of the array to have a common optical phase-locking mechanism. In contrast, other devices which depend on evanescent coupling or other standard types of coupling such as linear arrays are limited by the ability to maintain coherence from the first device in the array to the last. In these latter devices coupling occurs between adjacent devices wherein the present invention provides coupling of radiation from each device into all other devices.

Figure 6:
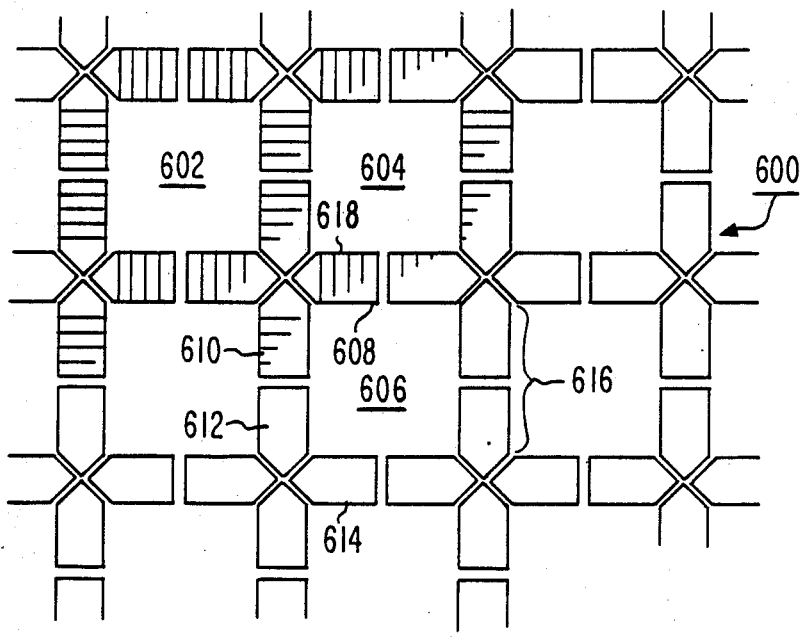
FIGS. 6 and 7 are schematic plan view diagrams of portions of systems similar to the system of FIG. 5 to illustrate different contact connections to the different laser gain sections in the arrays.
Figure 7:
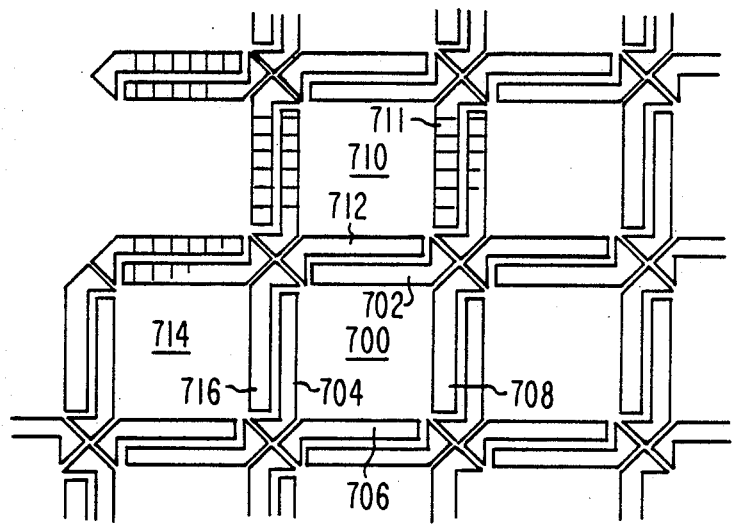

FIGS. 6 and 7 illustrate different alternative electrode configurations for use with the cell arrays of FIG. 5. In FIG. 6, the electrode array shown is deposited, by way of example, on a Beryllium oxide heat sink layer which is a thermal conductor and electrical insulator. The array 600 of electrodes comprises electrode cells such as cell 602, 604, 606 and so forth. Cell 602 corresponds, for example, to cell 520, FIG. 5. Cell 604 corresponds to cell 522 and cell 606 corresponds to cell 524, by way of example Cell 606 of electrodes comprises a symmetrical array of electrode 608, 610, 612 and 614 and a mirror image electrode array 616. Electrodes 608 and 610 are mirror images of respective electrodes of 614 and 612. The lines 618 in electrode 608 represent the position of the different laser sections of the cell 524, FIG. 5. The electrode 608 corresponds and mates with the P-type contacts 39 (FIG. 2) of the lasers corresponding to laser array 526, FIG. 5. In FIG. 5, only five laser sections are illustrated in laser array 526. This is by way of illustration. In practice, more or fewer lasers may be in a given array. In the case of more lasers. e.g., 10, electrode 608 would contact half of that array, or five lasers at the electrode contacts 39. Similarly electrode 610 would make electrical contact with array 528, FIG. 5. Again array 528 is shown as five laser sections, but in practice it may comprise more as discussed above. Half of that laser array would make electrical contact with electrode 610, FIG. 6. The remaining electrodes would contact the corresponding array of laser sections in laser cells array 524, FIG. 5.

In operation of the electrode array of FIG. 6 in combination with the laser cells of FIG. 5, electrical currents of different values may be applied to different ones of the electrodes to provide a steering capability to the photons. In the alternative, the electrical current may be identical as applied to all electrodes of all arrays or some sub cells of the arrays 600. In the alternative to employing the electrodes of FIG. 6, the laser contacts of the cells of FIG. 5 may be connected electrically by a wire bonding process with the arrays of the sub arrays of each cell corresponding to the electrodes of FIG. 6 connected to an external terminal by a wire bonding process.

FIG. 7 illustrates a still different alternative structure of electrodes connected to the laser device sections of FIG. 5. For Example, cell 700 of electrodes comprises four electrodes 702, 704, 706 and 708. Electrodes 702 and 708 are mirror images of electrodes 700 and 704. Electrode 702 may connect all of the laser devices of the laser section array 526, FIG. 5. Electrode 704 may connect all of the lasers of section array 528 and so on.

The electrode array 710 is identical to the electrode array 700. Electrode 712 is a mirror image of electrodes 702 and contacts the same laser devices as electrode 702. Array 714 has electrode 716 which contacts the same laser devices as electrode 704 and is a mirror image of that electrode. The remaining electrodes of the different cell arrays are mirror images in similar fashion as illustrated. Different currents may be applied to the same or different laser sections in accordance with the goal of a given implementation. The lines on the electrodes, for example, the lines 711 on the electrodes of cell 710, represent the laser diode sections of array 527, FIG. 5.

It is to be understood that the particular orientation and arrangement of the grating array of FIGS. 1 and 3 is given by way of example and not by way of limitation. Different portions of the grating nodules of the grating 28, FIG. 1, may have different dimensions to provide different coupling affects in accordance with a desired implementation. Also the grating of one cell of the multiple cell array of FIG. 5 may dimensioned differently than the cells of other cells of the array. Also the grating orientations may differ somewhat in different regions to achieve a specific coupling effect as may be desired. The description provided herein is given by way of illustration and not by limitation.

What is claimed is:

1. A light coupling system for coupling radiation emitted by a semiconductor radiation emitting device comprising:
   a semiconductor substrate having a broad planar surface; and
   an optical grating overlying the substrate broad surface, said grating comprising a plurality of discrete nodules arranged in a grid and adapted to receive said emitted radiation along an optical axis lying in a plane parallel to the plane of said broad surface, the nodules being positioned so that a first portion of said received radiation reflects from the grating in a first direction along said optical axis and a second portion of the received radiation is deflected by the grating in a second direction different from said first direction.

2. The system of claim 1 wherein said nodules are aligned in linear parallel rows and linear parallel columns, the rows being oriented normal to said columns and in a given angular orientation relative to said optical axis.

3. The system of claim 1 wherein said nodules are each convex and of substantially uniform dimension and spacing.

4. The system of claim 1 wherein the nodules are so positioned in the grid to form a first grating period to reflect said received radiation along said optical axis and a second grating period to deflect said received radiation in said second direction transverse said axis.

5. The system of claim 4 wherein said nodules are positioned to emit a third portion of said received radiation from the surface of said grating transverse the plane of said broad surface.

6. The system of claim 1 wherein the grid is arranged in a layer so that a third portion of said received radiation passes through that layer in a third direction opposite the first direction.

7. The system of claim 1 further including at least one first semiconductor light emitting device coupled to said grating for emitting radiation in said second grating in a direction parallel to said optical axis and at least one second semiconductor light emitting device coupled to said grating for emitting radiation in said different direction, said grating being oriented to deflect the light emitted by each device to the other device.

8. The system of claim 7 where the grid is dimensioned to provide phase-locking of the radiation emitted by said at least one first and second devices.

9. The system of claim 7 including a first plurality of said at least one first device and a second plurality of said at least one second device, each device of the first plurality emitting radiation parallel to the optical axis and each device of the second plurality emitting radiation parallel to the transverse direction.

10. The system of claim 9 wherein the grid is so arranged that the radiation of each device is coupled to each other device.

11. A radiation processing array comprising:
    a semiconductor substrate having a planar major surface;
    a first semiconductor radiation emitting device formed on the substrate, said device having a first optical axis defining a first radiation path parallel to the plane of the major surface in a first direction;
    a plurality of nodular grating elements overlying said substrate coupled to receive radiation from said first path and arranged to deflect at least a portion of the received radiation to a second direction different than said first direction and parallel to said first major surface; and
    a second semiconductor radiation emitting device formed on said substrate spaced from the first device, said second device having a second optical axis defining a second radiation path parallel to said second direction, said second device receiving at least a portion of said deflected radiation, the second device emitting radiation in said second path to a second plurality of said elements, at least a portion of the emitted radiation from the second devices being deflected by said second plurality of elements in a direction parallel to the first direction.

12. The array of claim 11 wherein at least a portion of the radiation from said first and second devices is caused to be emitted by said elements in a direction intersecting the plane of said major surface.

13. The array of claim 11 wherein said first and second devices are lasers which are phased-locked.

14. The array of claim 11 wherein said elements are spaced from one another in two orthogonal directions.

15. The array of claim 14 wherein the elements are of substantially uniform dimension and located in a symmetrical grid.

16. The array of claim 14 wherein said elements are arranged in a grid array in which the elements are aligned in two intersecting directions parallel to the plane of said major surface.

17. The array of claim 14 wherein the elements lie in a grid array in which the elements are aligned in said orthogonal directions about 45° to the directions of said first and second optical axes.

18. The array of claim 11 further including a plurality of said devices, a first of said plurality of devices being located in a region between first and second pluralities of said elements for receiving and emitting radiation to each said first and second pluralities of elements.

19. The array of claim 18 further including a second and third plurality of said devices, the optical axes of said second and third plurality of devices being oriented transverse the optical axis of said first plurality of devices.

20. A semiconductor light processing array comprising:
a semiconductor substrate having a planar major surface;
a plurality of spaced semiconductor light emitting laser devices formed on the substrate, a first plurality of said devices aligned in at least first and second spaced parallel rows for emitting and processing light propagating in a given direction, said rows extending in a first direction transverse the given direction;
a second plurality of said devices aligned on at least first and second spaced parallel columns, said columns and rows defining a central region, said second plurality of said devices for emitting and processing light propagating in said first direction, said columns extending in said given direction; and
a grating structure formed on the substrate in said central region between said rows and columns and optically coupled to a plurality of said devices for deflecting light emitted from at least one first device in one of said rows to at least one second device in at least one column.

21. The array of claim 20 including a plurality of said rows and columns forming a plurality of central regions, one of said regions being separated from a second region by one of said rows and columns, each region including said grating structure formed on said substrate.

22. The array of claim 20 wherein the grating structure comprises a grid of spaced grating nodules.

23. The array of claim 22 wherein the grid has a given orientation aligned about 45° to said given and transverse directions.

24. The array of claim 23 wherein at least one grating structure is dimensioned to surface emit radiation in a direction transverse to the plane of the major surface.

25. The array of claim 20 wherein the grating structure is dimensioned and spaced to optically couple the light from each device to each other device in the array.

26. An optical grating comprising:
a planar substrate; and
a grid of spaced nodular optical elements on the substrate adapted to receive semiconductor laser emitted radiation in a direction parallel to the plane of the substrate and adapted to deflect the received radiation to a direction different than the received direction.

* * * * *